United States Patent [19]

Minten

[11] Patent Number: 5,385,787
[45] Date of Patent: Jan. 31, 1995

[54] ORGANOSILANE ADHESION PROMOTION IN MANUFACTURE OF ADDITIVE PRINTED WIRING BOARD

[75] Inventor: Karl L. Minten, Greenville, S.C.

[73] Assignee: AMP-AKZO Corporation, Newark, Del.

[21] Appl. No.: 12,698

[22] Filed: Feb. 3, 1993

[51] Int. Cl.⁶ .............................................. B05D 1/00
[52] U.S. Cl. ...................................... 428/447; 427/96; 427/98; 427/304; 427/305; 428/446; 428/450
[58] Field of Search ................... 427/96, 304, 305, 98; 428/446, 450, 447

[56] References Cited

U.S. PATENT DOCUMENTS

| | | | |
|---|---|---|---|
| 3,508,983 | 4/1970 | Origer | 428/901 |
| 3,698,940 | 10/1972 | Mersereau | 427/98 |
| 3,873,499 | 3/1975 | Michael | 427/96 |
| 3,978,252 | 8/1976 | Lombardo et al. | 427/299 |
| 4,042,729 | 8/1977 | Polichette et al. | 427/304 |
| 4,100,312 | 7/1978 | Lombardo et al. | 427/96 |
| 4,159,222 | 6/1979 | Lebow | 427/96 |
| 4,499,152 | 2/1985 | Green et al. | 428/448 |
| 4,574,031 | 3/1986 | Dorey, II | 427/96 |
| 4,897,118 | 1/1990 | Ferrier et al. | 106/1.11 |
| 4,902,556 | 2/1990 | Benedikt et al. | 428/209 |
| 4,976,990 | 12/1990 | Bach | 427/98 |
| 5,061,550 | 10/1991 | Shimizu | 427/96 |
| 5,071,701 | 12/1991 | Tenney | 428/446 |
| 5,073,456 | 12/1991 | Palladino | 428/446 |
| 5,153,024 | 10/1992 | Schutyser | 427/97 |

FOREIGN PATENT DOCUMENTS

| | | |
|---|---|---|
| 241739 | 10/1987 | European Pat. Off. . |
| 310010 | 4/1989 | European Pat. Off. . |
| 3208198 | 9/1983 | Germany ................... 427/96 |

OTHER PUBLICATIONS

C. F. Coombs, Jr., "Additive Plating", Chapter 13, in Printed Circuits Handbook, 3rd Ed., pp. 13.1–13.18 (1988).

Primary Examiner—Shrive Beck
Assistant Examiner—Vi Duong Dang
Attorney, Agent, or Firm—Richard P. Fennelly; Louis A. Morris

[57] ABSTRACT

The metal (for example, copper) to base material adhesion in an additive printed wiring board is improved by contacting the base material with a solution containing a ureidosilane, preferably also comprising a disilyl crosslinking agent, followed by drying the solution to remove solvent, before contacting the base material with an activating agent for an electroless deposition step. Heating of the board, after the deposition of the metal, for example by baking in an oven or in an autoclave, gives the highest level of adhesion between metal and base material.

7 Claims, No Drawings

ORGANOSILANE ADHESION PROMOTION IN MANUFACTURE OF ADDITIVE PRINTED WIRING BOARD

BACKGROUND OF THE INVENTION

It is known to form a printed wiring board by the "additive process" in which a base material which has been suitably roughened is suitably activated and, at least in part, treated to electroless metal deposition. It is desired that the metal to base material adhesion be at suitably high levels so that delamination of the metal from the board is made appropriately difficult.

The use of organosilane compositions in forming additive printed wiring boards is not unknown. For example, U.S. Pat. No. 3,978,252 to M. S. Lombardo et al. discloses the treatment of an etched aluminum-clad laminate with silane compounds containing one lower alkyl amino substituted radical, rinsing of the treated substrate, activation, and electroless copper plating. The adhesion of copper to the substrate is said to be no more than about 10 pounds per inch. U.S. Pat. No. 4,897,118 to D. R. Ferrier et al. provides an insulating substrate with a resist to define areas where metallization is desired, the resist patterned substrate is then treated with a "conditioner" (which is preferably an organo-functional silane, which can include ureidoalkyl silane esters), adjuvant (preferably amine compounds), and deactivating agent. Rinsing of the treated board after application of conditioner and adjuvant, but before deactivating agent, is shown in the Examples contained in this patent. Thereafter, activation and electroless plating of metal onto the substrate is performed.

Recently, European Patent Publication No. 241,739 of C. R. Jones et al. has described application of a liquid or vaporous silicon compound to a dielectric substrate followed by treatment with oxygen plasma to, apparently, convert the silicon moieties on the substrate to silicon dioxide with etching away of the organic moieties contained between the silicon entities. Electroless deposition of metal (which may be followed by electrolytic deposition) can be used to treat the plasma treated substrate.

Organosilane compositions have also been used in regard to making metal-plastic laminates useful in fabrication of circuit board products by processes which differ from the above-described additive process in which an appropriately treated base material is activated and then electrolessly plated with metal. For example, U.S. Pat. No. 4,100,312 to M. S. Lombardo et al. applies an organic silicon compound to a sacrificial metal foil, dries the treated foil, and then laminates the treated foil to a plastic substrate. U.S. Pat. No. 4,499,152 to R. W. Green et al. vapor deposits metal on a carrier sheet, coats the metal with a metal oxide layer, treats the metal oxide layer with a coupling agent (e.g., an organo-functional silane), and laminates the composite to a substrate. The carrier sheet can then be removed. U.S. Pat. No. 4,902,556 to G. M. Benedikt et al. discloses treatment of a metal foil with silane and lamination of the treated foil to an epoxy prepreg, for example. A more recent patent, which happens to focus on the use of a ureidosilane bonding mixture containing a disilyl crosslinking agent is U.S. Pat. No. 5,073,456 to J. V. Palladino which discloses application of the bonding mixture to the surface of an oxide/hydroxide formed on copper circuitry formed on a dielectric support. The combination of support, copper, oxide-hydroxide, and bonding mixture is laminated to one or more similar laminates. Of similar teaching to the Palladino reference is European Patent Publication No. 310,010 which contains a wider disclosure of organosilane compounds without a disilyl crosslinking agent in an analogous lamination process.

SUMMARY OF THE INVENTION

In a process for the manufacture of an additive printed wiring board wherein a base material is provided with a conductive pattern comprising electrolessly deposited metal by activating said base material and electrolessly plating the metal, the improvement which comprises providing a bond strength improvement for the metal to base material bond by contacting the base material with a solution containing a ureidosilane and drying the solution containing the ureidosilane to remove solvent therefrom before contacting the base material with the activation solution.

DESCRIPTION OF PREFERRED EMBODIMENTS

The present invention relates to the novel use of a solution comprising a ureidosilane in a conventional process for making an additive printed wiring board. The solution is applied to the base material used in such a process, the solution is dried to remove solvent therefrom, and the treated base material is then treated with activation solution prior to an electroless metal deposition step. An elucidation of the overall additive metallization process to which the present invention is applicable, to the extent that the subsequent description does not specifically describe such a process, is to be found in Printed Circuits Handbook, 3rd Edition, Chapter 13, Clyde F. Coombs, ed., MacGraw-Hill, New York, which is incorporated herein by reference.

The base material which is treated herein is preferably a roughened base material, such as glass-reinforced epoxy, which has been formed by etching away the metal from a metal foil-clad dielectric substrate or by the suitable roughening of a coated dielectric by chemical etching, by treatment by plasma, or by ion milling. Optionally, one or more holes (or "vias") can be drilled in the base materials for the purpose of interconnection of more than one printed circuit pattern on one or more base materials as would be apparent to the person of ordinary skill in the art.

The next step is the novel step in accordance with the present invention in which a solution containing a ureidosilane compound, preferably containing a disilyl crosslinking agent, is applied to the roughened base material and dried to form an adhesion promotion layer for subsequent activation and electroless metal deposition. The ureidosilane can be of the formula

where A is alkylene, e.g., of 1 to 8 carbon atoms and B is independently hydroxy of $C_1$-$C_8$ alkoxy, and n is an integer of 1 to 3. A preferred compound is gamma-ureidopropyltriethoxy silane. Preferably, a disilyl crosslinking agent is also present and has the formula

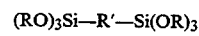

where R are independently $C_1$ to $C_8$ alkyl and R' is $C_{to}$ $C_8$ alkylene. A preferred compound is 1,2-bis(trimethoxysilyl) ethane. The weight ratio of ureidosilane to crosslinking agent is more preferably from about 90:10 to about 70:30.

After application and drying of the solution containing the ureidosilane and, preferably disilyl crosslinking agent, the treated base material is treated to conventional activation (e.g., with palladium) and electroless deposition with metal (e.g., with copper). If desired, a full built electroless process can be performed in which the desired metal thickness is achieved using only electroless metal deposition after application of a suitable resist formulation to mask areas where metal deposition is not desired. Alternatively, a thin (or "flash") electroless metal layer can be deposited on the ureidosilane-treated base material to serve as a conductor for later electrolytic metal deposition, the "flash" deposited layer can have resist applied to mask those areas in which metal deposition is not desired, additional metal can be deposited electrolytically in unmasked areas using an electrolytically activated plating bath, and resist with adherent "flash" underlayers can be removed from the substrate.

Final heat treatment, either with or without pressure, has been found to enhance the bonding strength between the deposited metal and the underlying base material. A combination of heat and pressure has been found to give particularly good results. If such a combination is to be used, an autoclave is preferably employed since such an apparatus, since it employs gas pressure, enables one to apply isostatic pressure (namely, pressure which is uniformly applied to all sides of a material) as contrasted to use hydraulic press which can only apply pressure from one direction. The application of pressure from all sides simultaneously results in better material movement and better control of the overall thickness of the resulting board. The combination of heat and pressure in the present invention achieves: (1) the recrystallization of the full build deposit in-situ; (2) the pressing of the deposit into the roughened surface of the board or base material while this recrystallization is taking place thereby allowing the copper to be "melted" into a conformational deposit on the roughened surface; and (3) the recrystallization of the copper in intimate contact with the silane coupling agent to insure the maximum possibility of adhesion.

The present invention is further illustrated by the Examples which follow.

EXAMPLES 1–5

The following Examples illustrate the advantages of the present invention in regard to copper to base material peel strength.

Example 1 is a control run without heat treatment of the product whereas Example 2 is a control run which shows use of autoclave treatment and is a modified control run. Neither Example 1 nor Example 2 utilize the silane adhesion promotion step which forms an essential step in the present invention.

Examples 3–5 illustrate the present invention. In Example 3 the silane adhesion promotion step of the present invention was used, in Example 4 a baking step was additionally performed and in Example 5 an autoclave heat treatment step was additionally performed.

In all Examples a copper clad epoxy-glass base material (NELCO FR-4 board-1/1 oz) was etched with an ammoniacal type etchant (OLIN HUNT High Speed ACCUGUARD etchant) in a horizontal etch unit at 150 m/min. at 120° F. The resulting base material after removal of the copper foil was then subjected to a permanganate roughening step using a diethylene glycol monobutyl ether-based solvent swell composition (SHIPLEY 3302 brand) for seven minutes at 176° F., and sodium permanganate roughened (SHIPLEY 3308 brand) for five minutes at 170° F., and neutralizer (SHIPLEY 3314 neutralizer) for two minutes at 70° F. The treated board was than dried at 170° C.–180° C. for 15–17 minutes.

In Examples 3–5 only, a silane adhesion promotion step was then performed. The preparation step for making a 67 gallon treatment solution for this step involved filling a 67 gallon sump to two-thirds of its volume with deionized water, adding 280 ml of acetic acid and 5 gallons of a gamma-ureidopropyltriethoxy silane coupling agent solution containing a 1,2-bis(trimethoxysilyl) ethane crosslinking agent (DURABOND 776 PT from McGean-Rohco). The resulting mixture was mixed for thirty minutes so as to be available for use. The mixture was applied to the selected boards in Examples 3–5 using a horizontal spray module (top pressure: 20±2 lbs and bottom pressure: 19±2 lbs). A polyvinyl acetate sponge and squeege rollers were used in a filming module to provide a uniform coating (about 3–5 mils). The coated boards were then dried (125° F.–140° F. for thirty seconds to two minutes) horizontally at 48 m/min. with an knifer.

The next step for all of Examples 1–5 was a conventional activation or catalysis procedure involving sequential application of a pre-activator solution (namely, SHIPLEY CATAPREP 404 brand for one minute dwell), followed by a noble metal type catalyst solution capable of activating an electroless deposition process (namely, SHIPLEY CATAPOSIT 44 brand for five minutes).

A full build electroless deposition of copper (to 1 mil) was then performed using SHIPLEY 8835 electroless copper plating bath for about ten-twelve hours to achieve the desired thickness.

In Example 4 a baking step (140°–160° C. for one to two hours) was used in conjunction with the silane adhesion promotion step to achieve copper recrystallization. Examples 1 and 3 (the latter including the silane also) did not use the bake step.

Examples 2 and 5 used an autoclave step with Example 5 also using the silane adhesion promotion step as well. The autoclave treatment had the chamber temperature, panel temperature, and pressure parameters described below as a function of the time (counted from the beginning of the run) in the autoclave:

Chamber Temperature: 90° F.–100° F. at 10–20 minutes; raising of the temperature and its maintenance at 250° F. at 30–80 minutes; raising and maintenance at about 360° F. at 90–240 minutes; and cooling to about 180° F. at 250–310 minutes.

Panel Temperature: a gradual rise from room temperature to 350° F. after about 140 minutes; maintenance at 345° F.–360° F. at 140–250 minutes; and gradual cooling to about 275° F. after 310 minutes.

Pressure: at about 30–40 pound per square inch (psi) up to about 90 minutes; at about 175 psi at 100–270 minutes; and reduction to about 75 psi at 310 minutes.

A total of ten sample runs were made with the following results being obtained:

| Example No. | Process Conditions | Peel Adhesion (lbs./in)* |
|---|---|---|
| 1 | Plate Only | 7.900 |
| | | 6.872 |
| | | 5.720 |
| | | 5.360 |
| 2 | Plate + Autoclave | 8.672 |
| | | 8.452 |
| | | 7.116 |
| | | 6.884 |
| 3** | Plate + Silane | 11.650 |
| | | 10.340 |
| | | 9.868 |
| | | 14.460 |
| 4** | Plate + Silane + Bake | 19.38 |
| | | 11.41 |
| | | 19.82 |
| | | 11.51 |
| 5** | Plate + Silane + Autoclave | 16.78 |
| | | 20.05 |
| | | 13.21 |
| | | 13.69 |

*four runs of each were made as shown below. The average values for the four runs were: 6.4 (Run 1); 7.8 (Run 2); 11.06 (Run 3); 15.05 (Run 4); and 15.73 (Run 5).
**In accordance with the invention.

The foregoing Examples include only certain embodiments of the present invention, and for that reason, should not be construed in a limiting sense. The scope of protection sought is set forth in the claims which follow.

I claim:

1. In a process for the manufacture of an additive printed wiring board wherein a dielectric base material is provided with a conductive pattern comprising electrolessly deposited metal forming a metal-to-dielectric base material bond by activating and electrolessly plating the metal, the improvement which comprises providing a bond strength improvement for the metal-to-dielectric base material bond by contacting the dielectric base material with a solution containing a ureidosilane, drying the solution containing the ureidosilane to remove solvent therefrom before contacting the dielectric base material with the activation solution prior to electrolessly depositing metal, and recrystallizing the electrolessly deposited metal.

2. A process as claimed in claim 1 wherein the dielectric base material is a roughened material formed by etching a metal-foil clad dielectric substrate.

3. A process as claimed in claim 1 wherein the dielectric base material is a roughened material formed by etching a coated dielectric substrate.

4. A process as claimed in claim 1 wherein the ureidosilane solution also comprises a disilyl crosslinking agent.

5. A process as claimed in claim 1 wherein the dielectric base material is a roughened material formed by etching a copper clad dielectric substrate.

6. A metallized dielectric substrate of enhanced metal to substrate bonding due to metal recrystallization which consists essentially of: (a) a roughened dielectric base material; (b) a disilyl-crosslinked ureidosilane adhesion promoter; and (c) an electroless plated metal layer.

7. A substrate as claimed in claim 6 having a metal to substrate bond strength of no less than about 10 lbs/inch.

* * * * *